United States Patent [19]

Tsugaru

[11] Patent Number: 5,111,269
[45] Date of Patent: May 5, 1992

[54] BIPOLAR TRANSISTOR STRUCTURE CONTAINING A RESISTOR WHICH ASSURES REDUCTION IN LAYOUT AREA

[75] Inventor: Kazunori Tsugaru, Kawasaki, Japan

[73] Assignee: Kabushiki Kaisha Toshiba, Kawasaki, Japan

[21] Appl. No.: 680,120

[22] Filed: Apr. 3, 1991

[30] Foreign Application Priority Data

Apr. 4, 1990 [JP] Japan ................................ 2-88357

[51] Int. Cl.⁵ .................... H01L 27/02; H01L 29/72; H01L 29/00
[52] U.S. Cl. .......................... 357/43; 357/35; 357/34; 357/37
[58] Field of Search .............. 357/35, 38, 39, 23.4, 357/22 G, 22 R, 37, 43, 34

[56] References Cited

U.S. PATENT DOCUMENTS 4,985,739 1/1991 Lapham et al. ..................... 357/22

FOREIGN PATENT DOCUMENTS 0139130 2/1985 European Pat. Off. .
2341203 9/1977 France .
1428742 3/1976 United Kingdom .

OTHER PUBLICATIONS

S. M. Sze, "Semiconductor Devices Physics and Technology", 1985, pp. 334-340.

Primary Examiner—Rolf Hille
Assistant Examiner—Wael Fahmy
Attorney, Agent, or Firm—Finnegan, Henderson, Farabow, Garrett and Dunner

[57] ABSTRACT

A N⁺-type buried layer is formed at the surface of a P-type semiconductor substrate so as to correspond to the region in which a bipolar transistor is to be formed. Formed on the semiconductor substrate surface containing the buried layer portion is a P-type epitaxial layer, in which an N-type well is formed which extends from the layer's surface to the buried layer. In the well, a first diffusion layer extending from the well's surface to the buried layer is formed as the collector. Also formed in the well is a P-type second diffusion layer, in which P⁺-type third and fourth diffusion layers are formed as a separate bases. An N⁺-type fifth diffusion layer is formed as an emitter between the third and fourth diffusion layers. A collector electrode, a base electrode, and an emitter electrode are taken from the first, third, and fifth diffusion layers, respectively, so that the fourth and fifth diffusion layers are connected to each other by an interconnection.

5 Claims, 4 Drawing Sheets

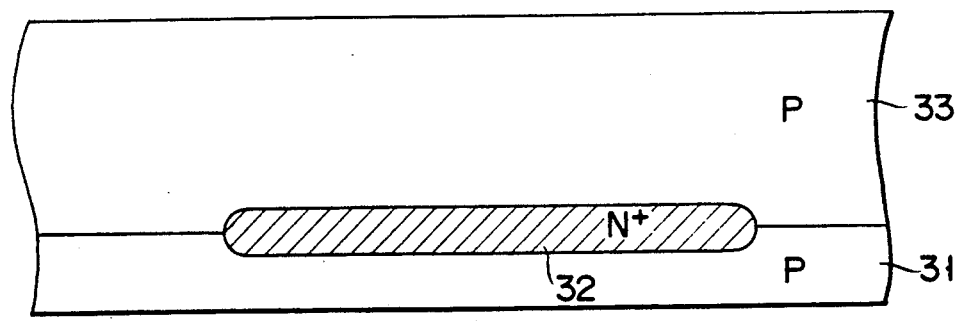
F I G. 1
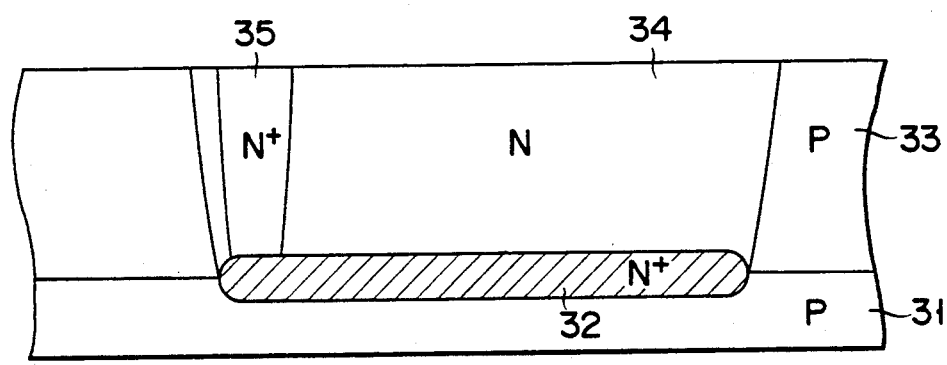
F I G. 2
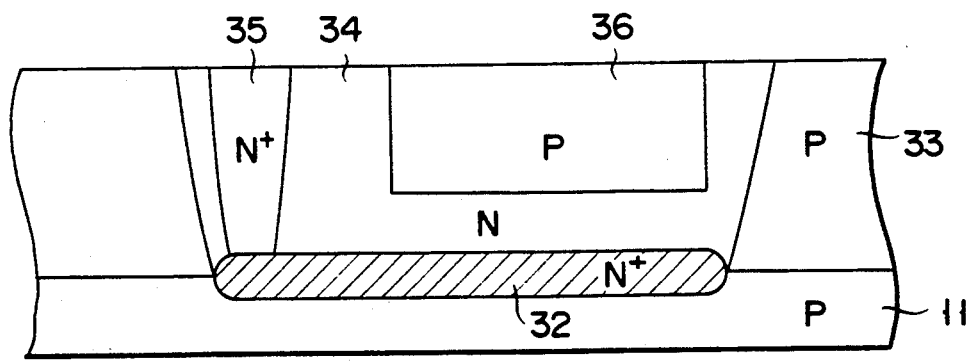
F I G. 3

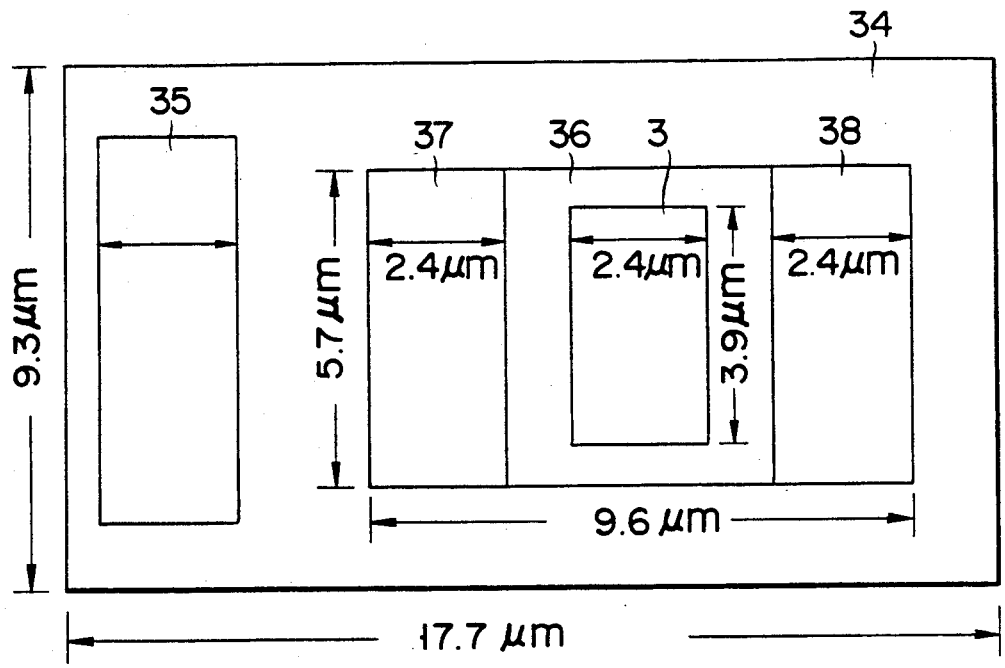
F I G. 6
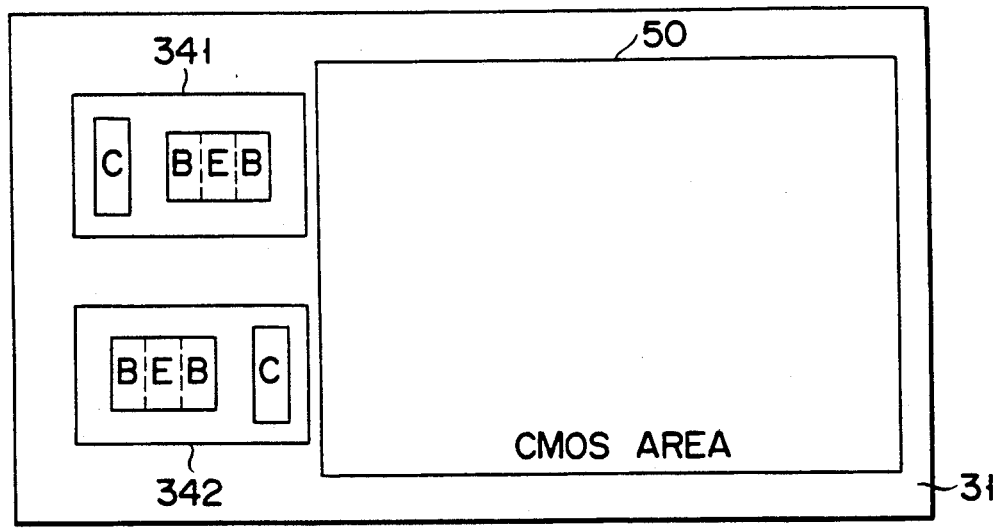
F I G. 7

BIPOLAR TRANSISTOR STRUCTURE CONTAINING A RESISTOR WHICH ASSURES REDUCTION IN LAYOUT AREA

BACKGROUND OF THE INVENTION

1. Field of the Invention

This invention relates to a semiconductor device containing bipolar transistors, such as a logic circuit using Bi-CMOS (a circuit composed of bipolar transistors and complementary MOS transistors).

2. Description of the Related Art

Logic gate circuits composed of Bi-CMOS circuits, or Bi-CMOS logic gate circuits, are widely used because of the high operating speed and low power consumption.

FIG. 8 shows a Bi-CMOS circuit, which contains a P-channel MOS transistor 11 and an N-channel MOS transistor 12, the gate electrodes of both transistors being supplied with an input signal. The source of the P-channel MOS transistor 11 is connected to a power supply $V_{CC}$ while the drain of the transistor 11 is connected via a resistor 13 to the drain of the N-channel MOS transistor 12, whose source is connected via a resistor 14 to the ground. The drain of each of MOS transistors 11 and 12 is connected to the base of each of NPN bipolar transistors 15 and 16, respectively. This arrangement of MOS transistors 11 and 12, bipolar transistors 15 and 16, and resistor 13 and 14 provides an inverter circuit.

In this inverter circuit, the resistor 13 (14) is connected across the base and emitter terminals of the NPN bipolar transistor 15 (16) as shown by a broken line.

FIG. 9 shows a layout pattern of Bi-CMOS circuitry with the above-mentioned arrangement on a semiconductor wafer 20. First set on this wafer 20 is an area 21 forming a basic CMOS cell, in which the P-channel MOS transistor 11 and N-channel MOS transistor 12 are formed. On both sides of the basic cell area 21, transistor areas 22 and 23, each forming bipolar transistors 15 and 16, are placed. Located adjacent to the transistor areas 22 and 23 are resistor areas 26 and 27 where resistor 13 and 14 are formed with diffused resistors 24 and 25.

That is, the bipolar transistors 15 and 16 are formed in places different from places in which resistors 13 and 14 are formed. The reason for making the resistors 13 and 14 of the diffused resistors 24 and 25 is to lower production costs.

The arrangement of the NPN bipolar transistors 15 and 16 and resistors 13 and 14 in separate places involves larger pattern areas for the diffused resistors 24 and 25, which, in turn, need separate well areas in which the areas 26 and 27 are set, resulting in the larger circuit layout area.

SUMMARY OF THE INVENTION

It is an object of the invention to provide a semiconductor device containing bipolar transistors used in such as a Bi-CMOS circuit, which assures a reduction in the layout area compared with conventional equivalents.

It is another object of the invention to provide a semiconductor circuit device that has similar functions to those with a circuit in which a resistor is connected across the base and emitter terminals of the bipolar transistor.

It is still another object of the invention to provide a semiconductor device containing transistors in which the resistor between the base and emitter terminals of the bipolar transistor is realized by effective use of diffusion regions that are formed by diffusing impurities in wells, not by use of diffused resistors.

In a semiconductor device according to the present invention, a first well for a bipolar transistor is formed at the main surface portion of a semiconductor substrate. Formed in the first well are a first diffusion region acting as the collector and a second diffusion region acting as the base. In the second diffusion region, third and fourth diffusion regions are formed apart from each other. Formed between the third and fourth diffusion regions is a fifth diffusion region, which is electrically connected to the fourth diffusion region.

A semiconductor device with this configuration provides a bipolar transistor whose collector is the first diffusion region, whose base is the third and fourth diffusion regions, and whose emitter is the fifth diffusion region. The fourth diffusion region, one of the diffusion regions constituting the bases, is electrically connected to the emitter made from the fifth diffusion region, below which the third and fourth diffusion regions are connected by the resistor element made up of the second diffusion region. Accordingly, the circuit with the resistor connected across the base and emitter of the bipolar transistor is formed, without using a diffused resistor or the like, in the region where the bipolar transistor has been formed in an ordinary way.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 1 through 4 are sectional views illustrating the manufacturing processes in sequence of a semiconductor device according to an embodiment of the present invention;

FIG. 6 is a schematic plane view of the bipolar transistor;

FIG. 7 shows a layout of a CMOS containing the bipolar transistor;

DETAILED DESCRIPTION OF THE PREFERRED EMBODIMENTS

Figure 4:
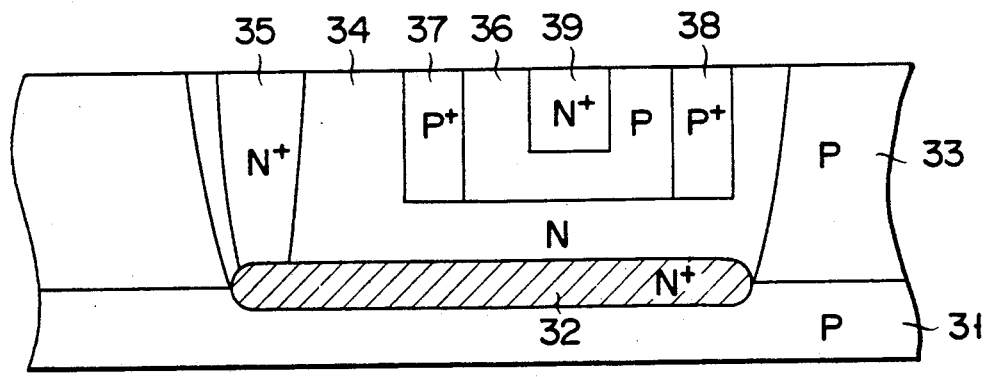

A semiconductor device according to the present invention will be explained in the order of manufacturing processes. First, at the surface of a P-type semiconductor substrate 31 made from, for example, silicon, a photographic mask pattern is formed using photolithography as shown in FIG. 1. In the photographic mask pattern, an opening is made at a place where a bipolar transistor is to be formed. Through the mask pattern, antimony (Sb) is diffused into the surface of the semiconductor substrate 31 to form an $N^+$-type buried layer 32. On the surface of the semiconductor substrate 31 in which the buried layer has been formed, a P-type silicon is grown epitaxially to form a P-type epitaxial layer 33.

Then, as shown in FIG. 2, phosphorous (P) ions are implanted into a specified portion at the surface of the P-type epitaxial layer 33. Specifically, with an accelerating voltage of 160 KeV at a dose rate of $3 \times 10^{12}$, ion implantation of phosphorous is carried out to form an N-type well 34 in the P-type epitaxial layer 33, which portion is located the N+-type buried layer 32.

After the well 34 is formed at the place where a bipolar transistor is to be formed, phosphorous (P) ions are implanted into the well 34 through the photographic mask pattern. Specifically, with an accelerating voltage of 50 KeV at a dose rate of $5 \times 10^{15}$, phosphorous ions are implanted into the region acting as the collector of the bipolar transistor so that the ions may reach the N+-type buried layer 32 to form a first diffusion region 35 of N+-type. The impurity atom concentration in the first diffusion region 35 is set at a higher value than that in the N+-type buried layer 32.

After the N+-type first diffusion region 35 is formed as the collector in the well 34, boron fluoride (BF$_2$) ions are implanted through the photographic mask pattern into a portion adjacent to the first diffusion region 35 in the well 34, under conditions of an accelerating voltage of 30 KeV at a dose rate of $1 \times 10^{13}$. By using the same mask pattern, ion implantation of boron (B) is performed into the same portion of the well 34 with an accelerating voltage of 25 KeV at a dose rate of $5.6 \times 10^{13}$ to form a second diffusion region 36 serving as an intrinsic base region.

As shown in FIG. 4, boron fluoride (BF$_2$) ions are then implanted through a mask pattern into two regions opposite from each other in the second diffusion region 36, to form a P+-type third diffusion region 37 and a P+-type fourth diffusion region 38 facing and separating from each other. The FB$_2$ ions are implanted under conditions of, for example, an accelerating voltage of 40 KeV at a dose rate of $5 \times 10^{15}$, to form two separate bases.

After the third and fourth diffusion regions 37 and 38 are formed, arsenic (As) ions are implanted into a surface portion of the second diffusion region 36 and between the third and fourth diffusion regions 37 and 38 with an accelerating voltage of 40 KeV at a dose rate of $5 \times 10^{15}$, to form a fifth diffusion region 39 of N+-type acting as the emitter. The impurity atom concentration in the fifth diffusion region 39 is set at a value higher than that in the P-type diffusion region 36.

Figure 5:
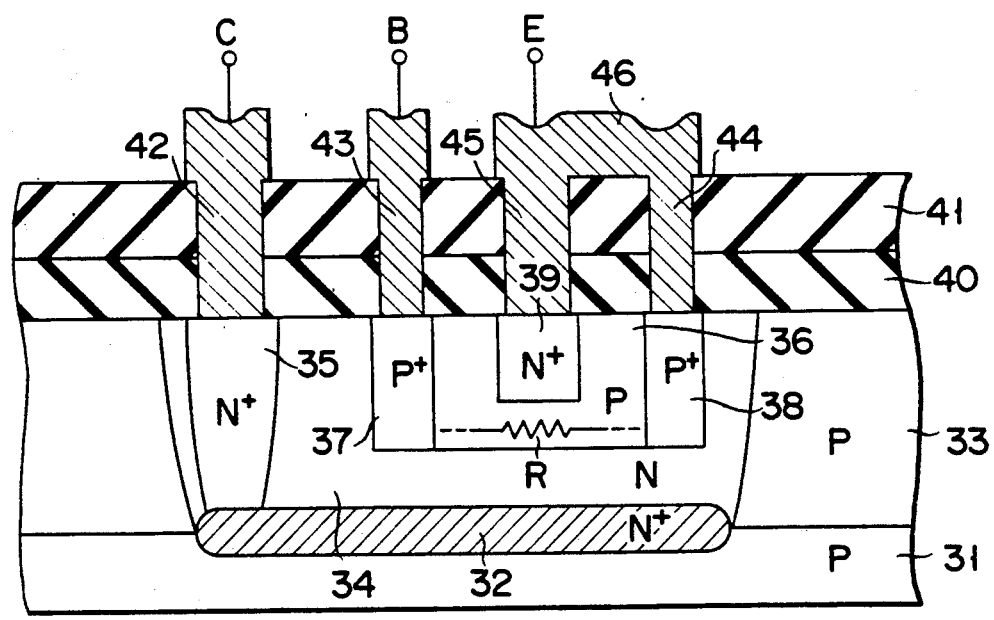
FIG. 5 is a sectional view of a semiconductor device thus produced, especially of a portion composing a bipolar transistor.

After the formation of the collector, bases, and emitter of a bipolar transistor is complete, as shown in FIG. 5, a silicon oxide film 40 and a PSG (silicate glass containing phosphorous) film 41 are formed on the epitaxial layer 33. In the films 40 and 41, contact holes are made which lead to the first diffusion region 35 as the collector, the third and fourth diffusion regions 37 and 38 as the bases, and the fifth diffusion region 39 as the emitter, respectively. In these holes, aluminum is embedded to form terminal electrodes 42, 43, 44, and 45. The terminal electrode 45 to the fifth diffusion region 39 and the terminal electrode 44 to the fourth diffusion region 38 are connected to each other with aluminum interconnection 46. The collector terminal C, base terminal B, and emitter terminal E are taken from the terminal electrodes 42, 43, and 45, respectively.

Figure 9:
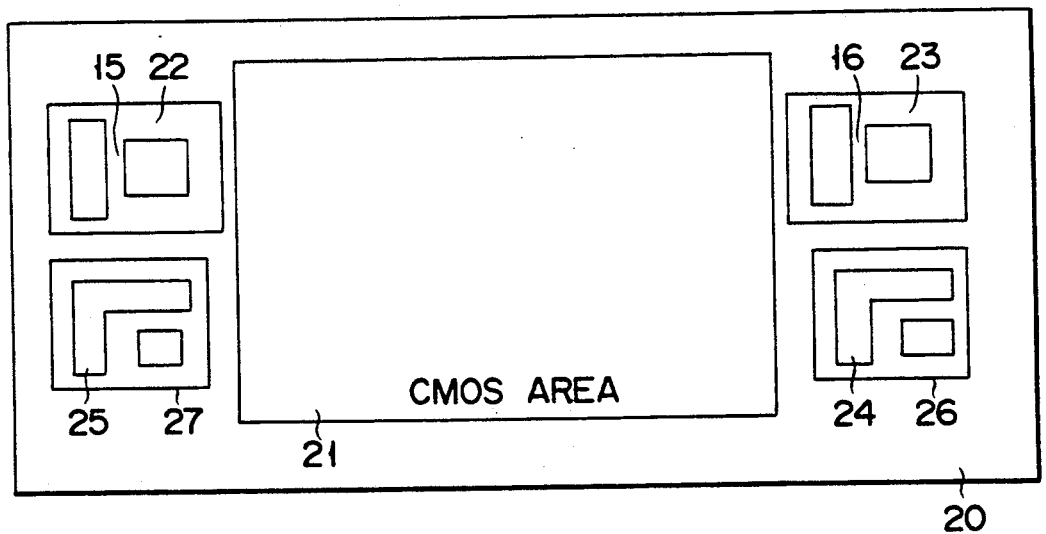
FIG. 9 illustrates a layout of the conventional Bi-CMOS circuit.

With this arrangement where an NPN bipolar transistor is formed on the semiconductor substrate 31, there is no need for separate wells to be formed in the semiconductor wafer and for diffused resistors to be formed in the wells as shown in FIG. 9.

The fourth diffusion region 38 and the fifth diffusion region 39 constituting the emitter are connected with the interconnection 46, while the third and fourth diffusion regions 37 and 38 are connected to each other via a bulk resistor R composed of the second diffusion region 36 just below the fifth diffusion region 39 constituting the emitter. That is, the resistor R is formed so as to be connected across the base and emitter of the NPN bipolar transistor.

FIG. 6 is a schematic plane of an NPN bipolar transistor thus produced. In the N-type well 34, the first diffusion region 35 is formed as the collector region, next to which the P-type second diffusion region 36 is formed. The P+-type third diffusion region 37 and fourth diffusion region 38 serving as the base regions are formed at both ends of the second diffusion region 36. Formed between the third and fourth diffusion regions 37 and 38 is the fifth diffusion region 39 acting as the emitter region.

In an NPN bipolar transistor of this arrangement, if the resistor R immediately below the fifth diffusion region 39 has a sheet resistance of 20 K$\Omega/\square$, the size of the fifth diffusion region 39 as the emitter is 2.4 $\mu$m $\times$ 3.9 $\mu$m, the resistance of the resistor R between the base and emitter will be:

$$R = 20 \times 2.4/3.9 = 12.3 \text{ (K}\Omega\text{)}$$

To make resistance of the resistor R smaller requires broadening the width of the fifth diffusion region 39 constituting the emitter. Thus, the resistance of the resistor connected across the base and emitter of the NPN bipolar transistor can be adjusted by changing the dimension of the fifth diffusion region 39.

Figure 8:
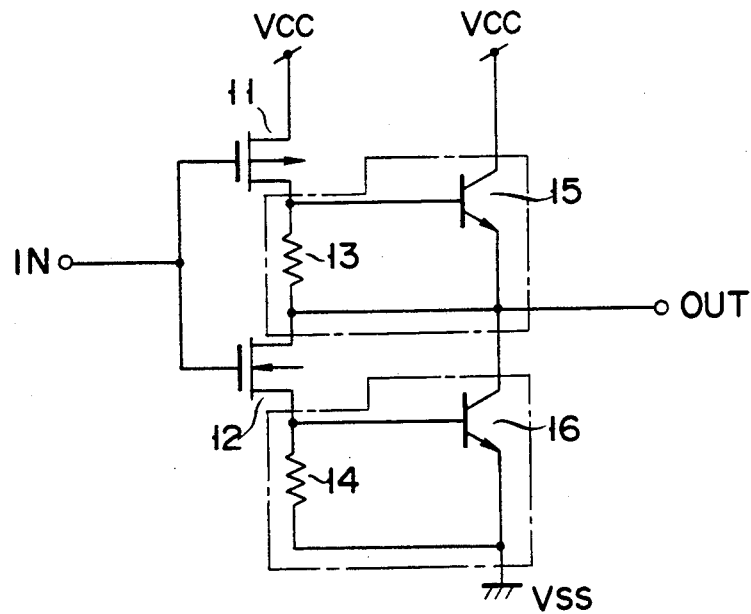
FIG. 8 is a circuit diagram of a conventional Bi-CMOS circuit.

FIG. 7 shows a layout of a Bi-CMOS circuit pattern embodying the circuit shown in FIG. 8 using the NPN bipolar transistor produced in the manner mentioned above. Set on the semiconductor substrate 31 is a basic cell area 50, in which the P-channel MOS transistor 11 and N-channel MOS transistor 12 shown in FIG. 8 are formed. On one side of the basic cell area 50, wells 341 and 342 are formed, in which NPN bipolar transistors 15 and 16 with the pattern shown in FIG. 6 are formed respectively. Here, symbol C indicated the collector corresponding to the first diffusion region 35, symbol B the base corresponding to the third and fourth diffusion regions 37 and 38, and symbol E the emitter corresponding to the fifth diffusion region 39.

With this configuration where the resistor connected between the emitter and base of the NPN bipolar transistor is realized by making use of the resistor formed directly below the emitter region, the Bi-CMOS circuit requires no special diffused resistor elements, assuring a reduction in the layout area for the circuit compared with conventional equivalents.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device containing bipolar transistors, comprising:

a semiconductor substrate of a first conductivity type;

a buried layer formed at the surface of said semiconductor substrate so as to correspond to a region in which a bipolar transistor is to be formed;

an epitaxial layer of the first conductivity type formed on said semiconductor substrate including said buried layer region;

a well of a second conductivity type formed in said epitaxial layer so as to correspond to said buried layer region, the impurity atom concentration of which is lower than that in said buried layer;

a first diffusion region of the second conductivity type formed so as to extend from the surface of said well to said buried layer, the impurity atom concentration of which is higher than that in said buried layer;

a second diffusion region of the first conductivity type formed at the surface of said well in the vicinity of said first diffusion region, the impurity atom concentration of which is higher than that in said second conductivity type well;

third and fourth diffusion regions of the first conductivity type each formed separately on opposite sides of said second diffusion region, the impurity atom concentration of which is higher than that in said second diffusion region;

a fifth diffusion region of the second conductivity type located between said third and fourth diffusion regions in said second diffusion region, the impurity atom concentration of which is higher than that in said second diffusion region, and directly under which a resistor is formed so as to connect said third diffusion region with said fourth diffusion region; and an interconnection electrically connecting said fourth diffusion region with said fifth diffusion region;

wherein said first diffusion region constitutes a collector, said third and fourth diffusion regions constitute bases, said fifth diffusion region constitutes an emitter, one of said bases and said emitter are connected with said interconnection, and said resistor is connected across said base and emitter.

2. A device according to claim 1, further comprising:

a basic CMOS cell region containing a P-channel and/or an N-channel MOS transistor, which is formed outside and in the vicinity of said well region in said semiconductor substrate.

3. A device according to claim 1, wherein said first conductivity type is P-type and said second conductivity type is N-type.

4. A device according to claim 1, wherein said resistor is a bulk resistor formed directly below said fifth diffusion region.

5. A semiconductor device containing bipolar transistors, comprising:

a P-type semiconductor substrate;

an $N^+$-type buried layer formed on said semiconductor substrate so as to correspond to a region in which a bipolar transistor is to be formed;

a P-type epitaxial layer formed on the surface of said semiconductor substrate including said buried layer region;

an N-type well formed in said epitaxial layer so as to correspond to said buried layer region, the impurity atom concentration of which is lower than that in said buried layer;

an $N^+$-type first diffusion region formed as a collector so as to extend from the surface of said well to said buried layer, the impurity atom concentration of which is higher than that in said buried layer;

a P-type second diffusion region formed at the surface of said well in the vicinity of said first diffusion region, the impurity atom concentration of which is higher than that in said N-type well;

$P^+$type third and fourth diffusion regions each formed separately as bases on opposite sides of said second diffusion region, the impurity atom concentration of which is higher than that in said second diffusion region;

an $N^+$-type fifth diffusion region located as an emitter between said third and fourth diffusion regions in said second diffusion region, the impurity atom concentration of which is higher than that in said second diffusion region, and directly under which a resistor is formed so as to connect said third diffusion region with said fourth diffusion region; and an interconnection electrically connecting said fourth diffusion region with said fifth diffusion region so that said resistor may be connected across said base and emitter.

* * * * *

UNITED STATES PATENT AND TRADEMARK OFFICE
CERTIFICATE OF CORRECTION

PATENT NO. : 5,111,269
DATED : May 05, 1992
INVENTOR(S) : Kazunori Tsugaru

It is certified that error appears in the above-identified patent and that said Letters Patent is hereby corrected as shown below:

Abstract, line 1, change "A" to --An--.

Abstract, line 12, before "separate" delete "a".

Claim 5, column 6, line 30, change "P+type" to --P+-type--.

Signed and Sealed this

Sixteenth Day of November, 1993

Attest:

BRUCE LEHMAN

*Attesting Officer*    *Commissioner of Patents and Trademarks*